US012632615B2

(12) United States Patent
Barker

(10) Patent No.: US 12,632,615 B2
(45) Date of Patent: May 19, 2026

(54) DATA SERIALIZATION EXTRUSION FOR CONVERTING TWO-DIMENSIONAL IMAGES TO THREE-DIMENSIONAL GEOMETRY

(71) Applicant: Boom Interactive Inc., Salt Lake City, UT (US)

(72) Inventor: Jeremiah Timberline Barker, Cottonwood Heights, UT (US)

(73) Assignee: Boom Interactive Inc., Salt Lake City, UT (US)

( * ) Notice: Subject to any disclaimer, the term of this patent is extended or adjusted under 35 U.S.C. 154(b) by 138 days.

(21) Appl. No.: 16/900,500

(22) Filed: Jun. 12, 2020

(65) Prior Publication Data

US 2020/0394343 A1 Dec. 17, 2020

Related U.S. Application Data

(60) Provisional application No. 62/860,461, filed on Jun. 12, 2019.

(51) Int. Cl.
*G06F 30/13* (2020.01)
*G06F 3/04847* (2022.01)
(Continued)

(52) U.S. Cl.
CPC .......... *G06F 30/13* (2020.01); *G06F 3/04847* (2013.01); *G06F 18/214* (2023.01); *G06T 7/13* (2017.01); *G06T 7/181* (2017.01); *G06T 7/40* (2013.01); *G06T 7/90* (2017.01); *G06T 15/04* (2013.01); *G06T 17/00* (2013.01);
(Continued)

(58) Field of Classification Search
CPC .......... G06F 30/13; G06F 30/00; G06F 30/10; G06F 18/214; G06F 3/04847; G06T 11/203; G06T 7/13; G06T 7/60; G06T 7/12; G06T 11/206; G06T 11/20; G06T 7/181; G06T 7/90
See application file for complete search history.

(56) References Cited

U.S. PATENT DOCUMENTS

2008/0123141 A1* 5/2008 Noguchi .............. H04N 1/4092
358/2.1
2008/0208547 A1* 8/2008 Kim ........................ G06T 7/536
703/2
(Continued)

FOREIGN PATENT DOCUMENTS

CN 101114341 A * 1/2008

OTHER PUBLICATIONS

United States Patent and Trademark Office, "International Search Report", Sep. 4, 2020, International Application No. PCT/US20/37548.

*Primary Examiner* — Weiming He
(74) *Attorney, Agent, or Firm* — TechLaw Ventures, PLLC; Terrence J. Edwards

(57) ABSTRACT

Systems, methods, and devices for data serialization extrusion of input images and raw input data. A method includes determining an input image comprising one or more lines and generating a bitmap based on the input image. The method includes performing edge detection on the bitmap to identify the one or more lines in the input image by applying a growth algorithm to pixels of the bitmap. The method includes calculating a pixel width of each of the one or more lines in the input image.

18 Claims, 9 Drawing Sheets

(51) Int. Cl.

| | |
|---|---|
| *G06F 18/214* | (2023.01) |
| *G06T 7/13* | (2017.01) |
| *G06T 7/181* | (2017.01) |
| *G06T 7/40* | (2017.01) |
| *G06T 7/90* | (2017.01) |
| *G06T 15/04* | (2011.01) |
| *G06T 17/00* | (2006.01) |
| *G06T 19/20* | (2011.01) |
| *G06V 10/44* | (2022.01) |
| *G06V 10/56* | (2022.01) |
| *G06V 10/764* | (2022.01) |
| *G06V 10/82* | (2022.01) |
| *G06V 20/64* | (2022.01) |

(52) U.S. Cl.
   CPC ............. *G06T 19/20* (2013.01); *G06V 10/44* (2022.01); *G06V 10/56* (2022.01); *G06V 10/764* (2022.01); *G06V 10/82* (2022.01); *G06V 20/647* (2022.01); *G06T 2207/20084* (2013.01); *G06T 2210/04* (2013.01); *G06T 2219/2012* (2013.01)

(56)               References Cited

U.S. PATENT DOCUMENTS

| | | | |
|---|---|---|---|
| 2009/0110267 A1* | 4/2009 | Zakhor ..................... G06T 7/75 | |
| | | | 382/154 |
| 2012/0065944 A1 | 3/2012 | Nielsen et al. | |
| 2015/0062142 A1* | 3/2015 | Goel ..................... G06T 11/203 | |
| | | | 345/582 |
| 2019/0051051 A1 | 2/2019 | Kaufman et al. | |
| 2019/0243928 A1* | 8/2019 | Rejeb Sfar ........... G06K 9/6256 | |
| 2020/0034629 A1* | 1/2020 | Vo ............................. A63F 1/18 | |
| 2021/0232719 A1* | 7/2021 | Ganihar ................. G06T 17/10 | |

* cited by examiner

400

Extrusion Algorithm
310

Bitmap
402

Edge Detection
404

Value
412

Line Weight Detection
406

Decay
414

Region Detection
408

Follow Peak
416

Serialized Data
314

402

304

| 0 | 0 | 1 | 0 |
|---|---|---|---|
| 0 | 1 | 2 | 1 |
| 0 | 0 | 1 | 0 |
| 0 | 0 | 0 | 0 |

FIG. 7

| 1 | 2 | 3 | 3 | 2 | 1 |
|---|---|---|---|---|---|
| 1 | 2 | 2 | 2 | 2 | 1 |
| 1 | 1 | 2 | 2 | 1 | |
| | 1 | 1 | 1 | 1 | |

FIG. 8

DATA SERIALIZATION EXTRUSION FOR CONVERTING TWO-DIMENSIONAL IMAGES TO THREE-DIMENSIONAL GEOMETRY

CROSS-REFERENCE TO RELATED APPLICATION

This application claims the benefit of U.S. Provisional Patent Application No. 62/860,461, filed Jun. 12, 2019, titled "STANDALONE AND ONLINE PLATFORM FOR SELECTING, ORGANIZING AND NETWORKING PHYSICAL CONSTRUCTION PROJECTS USING 3 DIMENSIONAL REAL-TIME RENDERING EDITOR," which is incorporated herein by reference in its entirety, including but not limited to those portions that specifically appear hereinafter, the incorporation by reference being made with the following exception: In the event that any portion of the above-referenced provisional application is inconsistent with this application, this application supersedes the above-referenced provisional application.

TECHNICAL FIELD

The present disclosure relates to image processing and particularly rates to data serialization extrusion.

BACKGROUND

Residential and commercial construction and remodeling projects can be extraordinarily complex. A relatively simple residential remodeling project, for example, can require multiple parties to make numerous decisions regarding floorplans, constructions materials, design materials, furnishings, and so forth. It is challenging to visualize how different construction and design materials will look together in a specific space. Further, and particularly for new-build construction or extensive remodeling, it can be challenging to visualize how a floorplan or cabinetry layout will look and feel.

Construction and design rendering programs currently known in the art are difficult to use and primarily directed for use by professionals who are trained to use a specific program. Additionally, these construction and design rendering programs can be extraordinarily expensive and are cost-prohibitive for average consumers. There is a need for a simple-to-use design rendering program that can generate three-dimensional renderings of a space based on two-dimensional drawings. Such a program would be useful for numerous entities in the construction and remodeling industries and would enable consumers to visualize a space with specific constructions materials prior to beginning construction.

In light of the foregoing, disclosed herein are systems, methods, and devices for improved design rendering programs. Specifically disclosed herein are systems, methods, and devices for data serialization extrusion of a two-dimensional drawing to generate a geometric three-dimensional rendering.

BRIEF DESCRIPTION OF THE DRAWINGS

Non-limiting and non-exhaustive implementations of the present disclosure are described with reference to the following figures, wherein like reference numerals refer to like or similar parts throughout the various views unless otherwise specified. Advantages of the present disclosure will become better understood with regard to the following description and accompanying drawings where:

FIG. 7 illustrates an exemplary pixel grid comprising assignments generated pursuant to a growth and/or decay algorithm;

FIG. 8 illustrates an exemplary pixel grid comprising assignments generated pursuant to a growth and/or decay algorithm.

DETAILED DESCRIPTION

Disclosed herein are systems, methods, and devices for data serialization extrusion and generating a three-dimensional rendering of a space. An embodiment of the disclosure comprises an extrusion algorithm to be executed by one or more processors for analyzing an input image. In embodiments of the disclosure, the input image may comprise a two-dimensional drawing of a floorplan, landscape design, commercial construction project, and so forth. The extrusion algorithm disclosed herein can be executed to perform data serialization extrusion on the two-dimensional drawing to generate a geometric vector diagram. In an embodiment, the geometric vector diagram is used to generate an interactive three-dimensional rendering corresponding with the two-dimensional drawing.

Before the methods, systems, and devices for image extrusion and rendering are disclosed and described, it is to be understood that this disclosure is not limited to the configurations, process steps, and materials disclosed herein as such configurations, process steps, and materials may vary somewhat. It is also to be understood that the terminology employed herein is used for describing implementations only and is not intended to be limiting since the scope of the disclosure will be limited only by the appended claims and equivalents thereof.

In describing and claiming the disclosure, the following terminology will be used in accordance with the definitions set out below.

It must be noted that, as used in this specification and the appended claims, the singular forms "a," "an," and "the" include plural referents unless the context clearly dictates otherwise.

As used herein, the terms "comprising," "including," "containing," "characterized by," and grammatical equivalents thereof are inclusive or open-ended terms that do not exclude additional, unrecited elements or method steps.

A detailed description of systems, methods, and devices consistent with embodiments of the present disclosure is provided below. While several embodiments are described, it should be understood that this disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments may be practiced without some or all of these details. Moreover, for clarity, certain technical material that is known in the related art has not been described in detail to avoid unnecessarily obscuring the disclosure.

Figure 1:
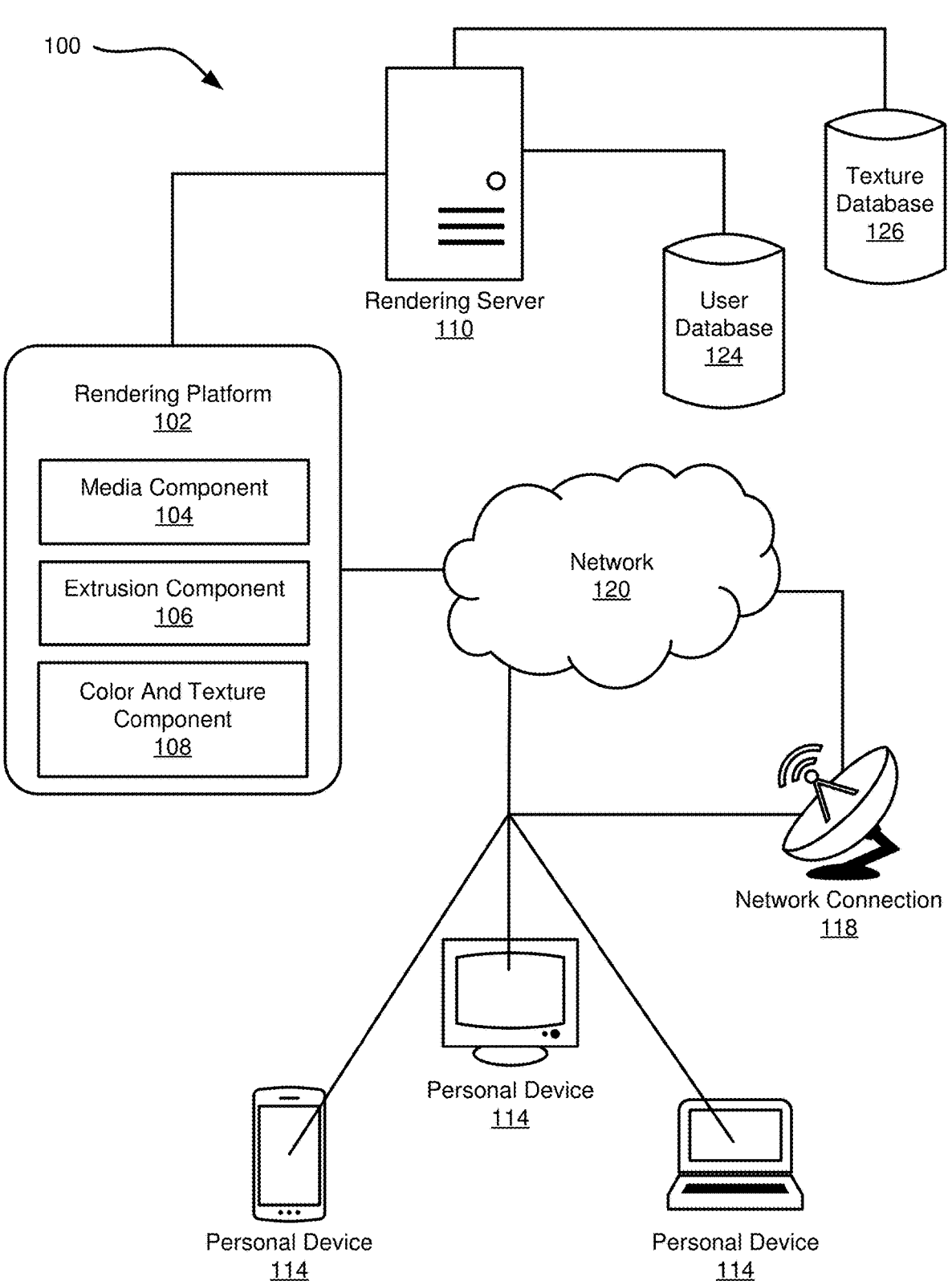
FIG. 1 is a schematic diagram of an design rendering system comprising a rendering platform operated by a rendering server in communication with a network.

Referring now to the figures, FIG. 1 is a schematic diagram of a system 100 for image rendering and visualization. The system 100 includes a rendering platform 102 in communication with a rendering server 110 and a network 120. The network 120 is in communication with the rendering server 110, and access to the network 120 may be achieved by way of a network connection 118 that may be connected with the rendering server and/or individual devices such as a personal device 114.

The rendering platform 102 includes one or more of a media component 104, an extrusion component 106, and a color and texture component 108. The rendering platform 102 may include further components and may be configured to perform additional instructions, for example according to the rendering platform 102 as discussed in FIG. 2. The rendering platform 102 can be accessed by way of a personal device 114 such as a smart phone, a tablet, a laptop, a personal computer, and so forth.

The media component 104 of the rendering platform 102 is configured to analyze and assess input media in furtherance of generating a three-dimensional rendering of a space. The media component 104 is configured to perform image recognition to identify objects, colors, shapes, textures, constructions materials, and so forth within media data. In an embodiment, the media component 104 comprises a neural network trained for image recognition and identification of objects, colors, shapes, textures, construction materials, and so forth.

In an embodiment, a user uploads media to the rendering server 110 by way of a user interface for the rendering platform 102. This media may be stored in one or more of the user database 124 and/or the texture database 126. The media may comprise images, videos, hyperlinks, products available in the marketplace, product Stock Keeping Units (SKUs), user-specified parameters, and so forth. The media component 104 is configured to analyze and assess the media to identify pertinent construction materials, design materials, floorplan preferences, textures, colors, and so forth. These identified materials and preferences may then be applied to a three-dimensional rendering of an interactive floorplan that may be customized to the user's own space.

For example, in an embodiment, the media comprises an image of an example kitchen that has been uploaded by the user. The user may indicate that the countertop shown in the image should be replicated and rendered in the user's own customizable three-dimensional rendering of the user's own kitchen floorplan. The media component 104 may be configured to analyze the image with a neural network to identify the countertop in the image and further to identify the color, texture, and/or type of countertop shown in the image. The media component 104 may, for example, determine that the example image comprises a marble countertop. The media component 104 may indicate that a marble countertop should be selected from the texture database 126, and then the marble countertop should be applied to the user's personalized and customizable rendering of the user's own kitchen floorplan.

The extrusion component 106 of the rendering platform 102 converts an input two-dimensional drawing into a geometric vector diagram. The geometric vector diagram can be used by the rendering server 110 or some other service to generate an interactive three-dimensional rendering of the objects illustrated in the input two-dimensional drawing. In an embodiment, the input two-dimensional drawing illustrates the floorplan of a residential or commercial construction project, a residential or commercial remodeling project, a landscaping construction project, and/or a landscaping remodeling project. The input two-dimensional drawing may be a computer-generated line drawing that follow traditional blueprint conventions for a construction or remodeling project. The input two-dimensional drawing may be a computer-generated line drawing that does not follow traditional blueprint conventions, and may alternatively be a hand-drawn floorplan, a photograph taken of a printed computer-generated or hand-drawn floorplan, and so forth. The extrusion component 106 analyzes and assess an input two-dimensional drawing and generates serialized data comprising a vector diagram equivalent to the floorplan illustrated in the input two-dimensional drawing. The vector diagram can be used to generate an interactive, customizable, three-dimensional rendering of the floorplan illustrated in the input two-dimensional drawing.

The color and texture component 108 of the rendering platform 102 applies colors, textures, constructions materials, design materials, user-defined preferences, and so forth to a three-dimensional rendering of a space. In an embodiment, the color and texture component 108 receives one or more indications from a user comprising parameters and preferences for the three-dimensional rendering. These parameters and preferences may comprise desired design materials such as tile, countertop, flooring, paint, and so forth, along with desired construction materials such as windows, doors, cabinetry, and so forth, along with desired floorplans and configurations. The color and texture component 108 implements these parameters and preferences into a three-dimensional rendering of the user's own space.

In an embodiment, the color and texture component 108 comprises a neural network trained to generate realistic renderings of countertops, flooring, tile, floorplans, windows, doors, and so forth. In an embodiment, the neural network comprises a variational autoencoder (VAE), a generative adversarial network (GAN), and/or a variational autoencoder generative adversarial network (VAE-GAN). The color and texture component 108 may be trained to combine a desired color with a desired texture. The texture and/or the color may be stored in the texture database 126. The color and texture component 108 may create a new never-before-created color-texture combination according to a user's preferences.

The personal device 114 is any personal computing device that can communicate with the rendering server 110. The personal device 114 may include a smart phone, a tablet, a laptop, a personal computer, virtual or augmented reality device, and so forth. Personal devices 114 may communicate with the rendering server 110 by way of a local area network (LAN) connection, a wide area network (WAN) connection, or another network connection. In an embodiment, personal devices 114 can connection to a network 120, such as a cloud computing network or the Internet, by way of a network connection 118.

The user database 124 is in communication with the rendering server 110. The user database 124 stores information about user accounts that are associated with the rendering platform 102. The user database 124 stores information about each user that has created an account with the rendering platform 102. The user database 124 stores, for example, personal user information, user preferences, data uploaded to the user's account, data saved to the user's account, aesthetic preferences designated by the user account, and so forth.

The texture database 126 is in communication with the rendering server 110. The texture database 124 stores media data comprising textures, colors, materials, and so forth that may be used for creating a rendering of a space. For example, the texture database 126 may comprise texture renderings and texture data for different mediums that may be used in architectural design. In an example implementation, the texture database 126 comprises texture information for a variety of a countertop options, for example, numerous colors of granite countertops, numerous colors of marble countertops, numerous colors of solid surface countertops, numerous colors of laminate countertops, and so forth. Further in the example implementation, the texture database 126 may comprise textures, shapes, and configurations for different types of tile, carpet flooring, hardwood flooring, laminate flooring, vinyl flooring, hardware, and so forth. The data stored in the texture database 126 is non-limiting, and any suitable data that may be used for generating a rendering of a space may be stored in and/or associated with the texture database 126.

Figure 2:
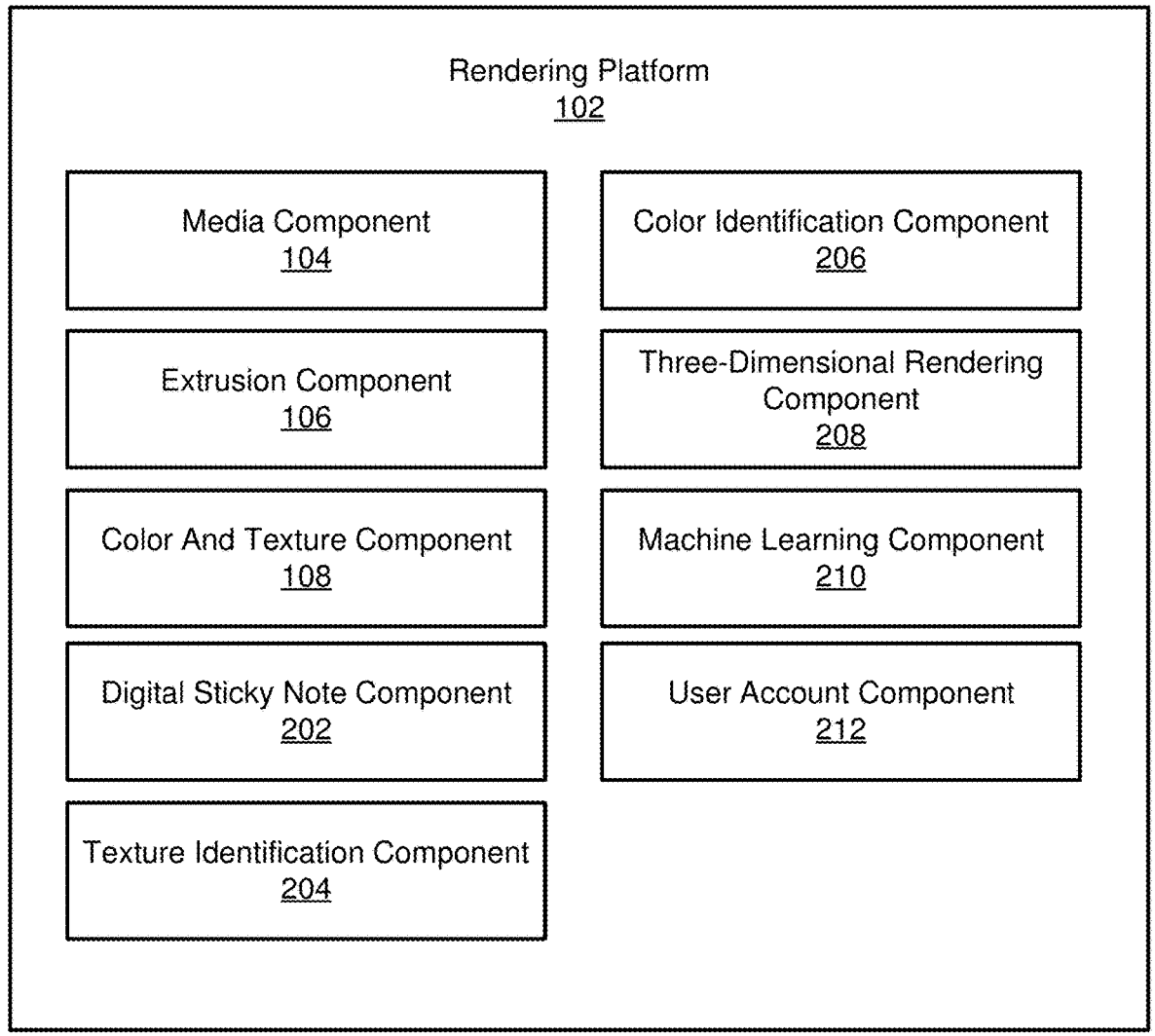
FIG. 2 is a schematic block diagram comprising illustrative components of a rendering platform.

FIG. 2 is a block diagram of the rendering platform 102. The rendering platform 102 includes the media component 104, the extrusion component 106, and the color and texture component 108 as discussed in FIG. 1. The rendering platform 102 may further include one or more of a digital sticky note component 212, a texture identification component 204, a color identification component 206, a three-dimensional rendering component 208, and a machine learning component 210.

For purposes of illustration, programs and other executable program components are shown herein as discrete blocks, although it is understood that such programs and components may reside at various times in different storage components of a computing device and are executed by one or more processors. Alternatively, the systems and procedures described herein can be implemented in hardware, or a combination of hardware, software, and/or firmware. For example, one or more application specific integrated circuits (ASICs) can be programmed to carry out one or more of the systems and procedures described herein. As used herein, the term "component" is intended to convey the implementation apparatus for accomplishing a process, such as by hardware, or a combination of hardware, software, and/or firmware, for the purposes of performing all or parts of operations disclosed herein. The terms "component" is intended to convey independence in how the modules, components, or their functionality or hardware may be implemented in different embodiments.

The digital sticky note component 202 stores and represents digital stick notes on two-dimensional media, three-dimensional media, a live editor or rendering of a scene, and so forth. The digital sticky note component 202 need not apply to only residential or commercial construction and/or landscaping projects and has application in numerous other industries. The digital sticky note component 202 generates a "digital sticky note" that serves as a digital representation of a graphical shape or object that is attached to a certain location on an image, photograph, video stream, real-time three-dimensional editor, and so forth. The digital sticky note comprising a location indicator relative to pertinent media, such as the image, photograph, video stream, and/or real-time three-dimensional editor. The digital sticky is movable by a user by way of a user interface. Additionally, in an embodiment, the rendering server and/or a neural network associated with the rendering server 110 generates a suggestion to place the digital sticky note at a certain location. The digital sticky note comprises information and data received from a user. This information and data may comprise manually-input parameters and preferences, media such as images, hyperlinks, video streams, and so forth, and/or information applicable to the location of the digital sticky note. In an embodiment, the digital sticky note comprises real-world location data such as global positioning system (GPS) coordinates.

In an example, a digital sticky note is applied to a three-dimensional rendering of a user's kitchen. The user manually creates the digital sticky note and places the digital sticky note on the countertop of the countertop in the three-dimensional rendering. The user uploads an image of an exemplary kitchen with the same countertop desired by user. The user may indicate that the countertop in the uploaded image should be replicated and applied to the countertop in the three-dimensional rendering. The user may upload a plurality of media comprising different possible ideas, exemplary designs, products, and so forth. The user may attach notes or thoughts to the digital sticky note to remind the user in the future of the thought process or progress in designing the countertop. In an embodiment, multiple users may view and edit the digital sticky note to coordinate with one another.

The texture identification component 204 is configured to identify a texture or type of material shown in media. In an embodiment, the texture identification component 204 comprises a neural network trained for image recognition to identify textures, colors, material types, and so forth illustrated within media.

In an example implementation, a user uploads an image of an exemplary kitchen and indicates that the backsplash tile in the exemplary kitchen should be applied to the user's personalized three-dimensional rendering of the user's own kitchen. The texture identification component 204 may provide the image to a neural network trained to locate the backsplash tile in the image. The same neural network or an additional neural network may be trained to identify the backsplash tile or identify a close approximation to the backsplash tile. After the backsplash tile has been identified or approximated, the texture identification component 204 may retrieve from memory the same tile texture and/or an approximated tile texture that is stored in the texture database 126. In an example, the tile in the exemplary kitchen is a white subway tile of a certain size. The texture identification component 204 is configured to locate the tile in the image of the exemplary kitchen, determine the tile is a white subway tile, and determine a size of the subway tile. The texture identification component 204 may additionally be configured to scan the user database 124 to retrieve a texture file corresponding with subway tile of the same size or a similar size. The texture file may be applied to the user's personalized three-dimensional rendering of the user's own kitchen.

The color identification component 206 is configured to identify a color shown in media. In an embodiment, the color identification component 206 comprises a neural network trained for image recognition to identify textures, colors, material types, and so forth illustrated within media. The color identification component 206 may be configured to locate a certain material within media uploaded by the user. The uploaded media may include images, photographs, video streams, hyperlinks, available products, product SKUs, and so forth. The color identification component 206 may comprise a neural network trained to locate a certain material or object within the media. In an example implementation, the color identification component 206 is trained to locate the cabinets in an image of an exemplary kitchen. The color identification component 206 is additionally configured to identify the color of a certain object in the media. In the example implementation, the color identification component 206 may be configured to identify the color of the cabinets in the image of the exemplary kitchen.

The color identification component 206 may additionally be configured to approximate the color of a certain structure or object within media. Further to the example implementation discussed above, the color identification component 206 may be tasked with identifying the color of cabinets within an image of an exemplary kitchen. However, based on the quality of the image and the lighting of the cabinets, the color of the cabinets might not be consistent throughout the image. The color identification component 206 may be configured to take an "average" color of the cabinets that most likely represents the color of the cabinets in real-life.

The three-dimensional rendering component 208 is configured to create a three-dimensional rendering of a space. The three-dimensional rendering component 208 may create the three-dimensional rendering using the serialized data (see 314 at FIG. 3) output by the extrusion algorithm (see 310 at FIG. 3). The serialized data 314 may include a geometric vector diagram indicating the (x,y,z) coordinates of walls, windows, doors, and other structures in a floorplan. In an alternative embodiment, the geometric vector diagram may include the (x,y,z) coordinates of hardscaping, trees, plants, retaining walls, lawn, and so forth in a landscaping design. The three-dimensional rendering component 208 is configured to create an interactive and personalized three-dimensional rendering of a space based on an input two-dimensional drawing of the space.

In an embodiment, the three-dimensional rendering component 208 provides the serialized data 314 output from the extrusion algorithm 310 to an external service configured to create the three-dimensional rendering. In such an embodiment, the three-dimensional rendering component 208 may be configured to convert the serialized data 314 into a certain file-type that can be used by an external rendering program.

The three-dimensional rendering is a three-dimensional model comprising individual geometric elements. The three-dimensional model is interactive in real-time and can be amended by a user by way of the rendering platform 102. The three-dimensional rendering may additionally include rendered images at different angles to illustrate additional view and details of the space. The three-dimensional rendering may be viewed with virtual reality or augmented reality modes.

The machine learning component 210 is configured to improve operations of the rendering platform 102 by analyzing past inputs, outputs, and issues experienced by the rendering server 110 during operation of the rendering platform 102. Additionally, the machine learning component 210 is configured to analyze media provided by a user to locate certain objects within the media, identify certain objects, materials, colors, textures, or surfaces within the media, and so forth. The machine learning component 210 may comprise one or more neural networks configured for different tasks and trained with different sets. The machine learning component 210 may comprise one or more of a radial basis forward (RBF) network, a deep feed forward (DFF) network, a recurrent neural network (RNN), a long/short term memory (LTSM) network, a gated recurrent unit (GRU) network, an autoencoder (AE) network, a variational autoencoder (VAE) network, a denoising autoencoder (DAE) network, a sparse autoencoder (SAE) network, a deep belief network (DBN), a deep convolutional network (DCN), a deconvolutional network (DN), a deep convolutional inverse graphics network (DCIGN), a generative adversarial network (GAN), a liquid state machine (LSM), an extreme learning machine (ELM), an echo state network (ESN), a deep residual network (DRN), a support vector machine (SVM), a neural Turing machine (NTM), and so forth. The type of neural network deployed by the machine learning component 210 may be selected based on the type of task to be executed by the machine learning component 210. Any suitable neural network may be used depending on the type of task to be executed and the efficiency of the neural network in executing that task.

The user account component 212 stores information pertaining to a user's account with the rendering platform 102. The user account component 212 may prompt the user to enter personal information or to create an account with the rendering platform 102. The user account component 212 may store information about data that has been uploaded, saved, or notated to the user account by the user or some other party. In an embodiment, a user creates a user account when engaging with the rendering platform 102 and that user account information is stored on the user database 124 in communication with the rendering server 110. The user may login to the user account by way of an Internet connection.

Figure 3:
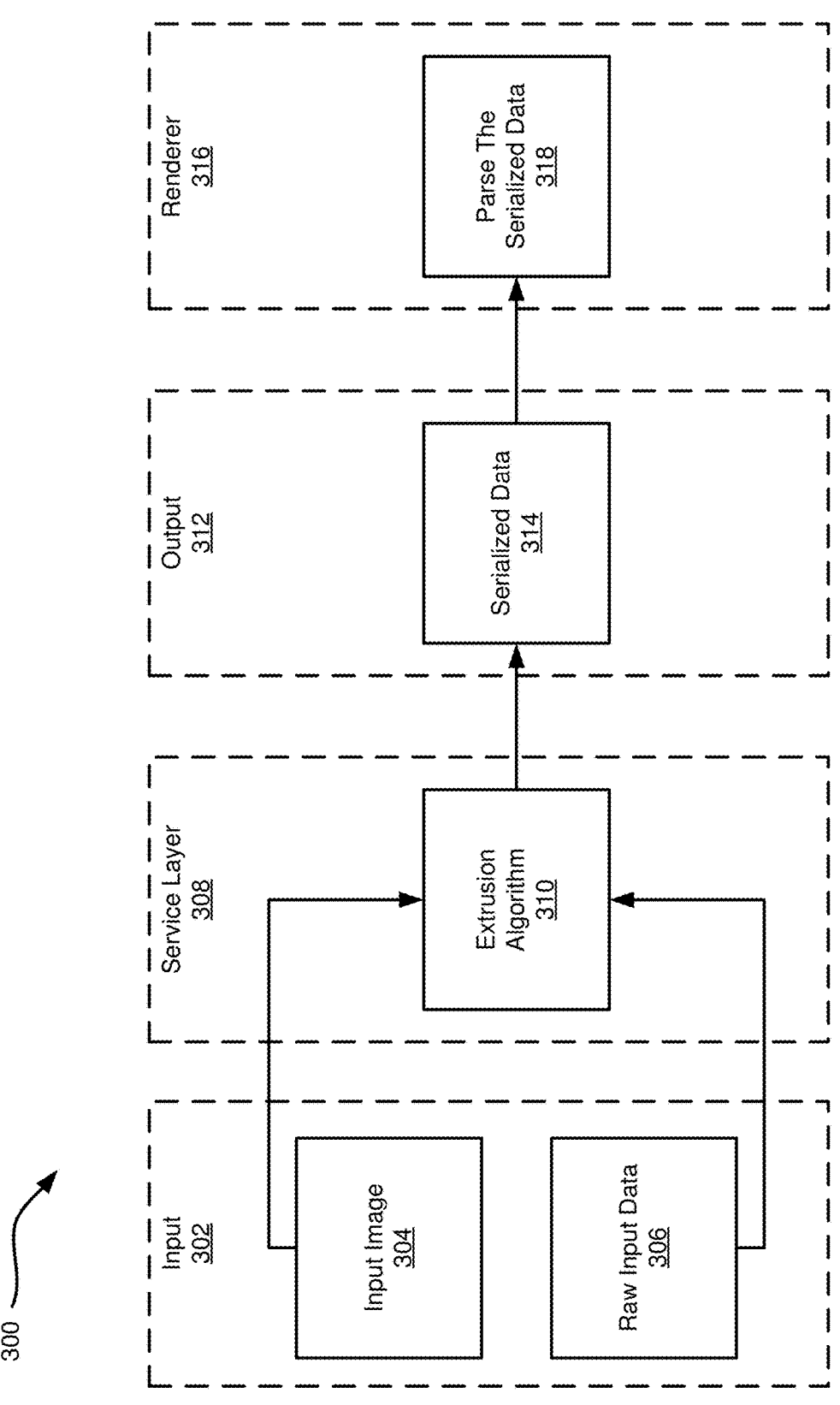
FIG. 3 is a schematic block diagram of a process flow for data serialization of a two-dimensional drawing to generate a three-dimensional geometric vector diagram.

FIG. 3 is a schematic drawing of a process flow 300 and component diagram for generating a three-dimensional output image based on input data. The process flow 300 may be referred to herein as an "extrusion" process for extruding information from a two-dimensional drawing to generate a three-dimensional rendering. The extrusion process includes two primary phases. The first phase includes receiving an input 302, providing the input 302 to the service layer 308 for performing the extrusion algorithm 310, and receiving the output 312 of the extrusion algorithm 310. The second phase of the extrusion process includes generating additional instructions to be provided to a renderer 316 in combination with the output 312 of the service layer 308. The additional instructions may include, for example, Z-axis coordinates, rulesets on what data should be kept and what data should be discarded, and/or three-dimensional mesh rules that enable the renderer 316 to generate the three-dimensional rendering.

The process flow 300 includes receiving inputs 302 including one or more of an input image 304 and raw input data 306. The process flow 300 includes providing the inputs 302 to a service layer 308 where the extrusion algorithm 310 is performed. The process flow 300 includes receiving output 312 from the service layer 308, wherein the output 312 may include serialized data 314. The process flow 300 includes providing the serialized data 314 to the renderer 316 that includes a parser 318 for generating a three-dimensional rendering based on the inputs 302.

In an embodiment, the renderer 316 and parser 318 are included in a third-party application for generating the three-dimensional rendering based on the inputs 302. Example third-party applications include Unity 3D, Unreal, Blender, 3DSMax, and Maya. One or more of these third-party applications can render the serialized data and parse what is needed to generate a three-dimensional model of the scene when provided with additional instructions on how to execute the rendering. These additional instructions enable a third-party application (or internal application) to visually extrude the code and add Z-axis coordinates to generate the three-dimensional model. In an embodiment, the parser 318 includes a neural network or provides information for training a neural network. The neural network may be trained on a set of rules regarding which artifacts should be kept and which artifacts should be discarded. In an embodiment, the system 100 further includes a library storing training information regarding what artifacts should be kept or discarded.

The input image 304 may include a drawing of an architectural floorplan, landscaping plan, or other diagram. In an embodiment, the input image 304 is a two-dimensional drawing, and in alternative embodiments the input image 304 may include a capture of a three-dimensional drawing. The input image 304 may include a computer-generated drawing, a hand-drawn drawing, a photograph of a printed computer-generated drawing, a photograph of a hand-drawn drawing, and so forth. The input image 304 may include any suitable data type such as, for example, jpg, jpeg, png, pdf, raw data captured by a camera image sensor, and so forth.

The raw input data 306 may include raw code from an augmented reality program. In an embodiment, an augmented reality program may be leveraged to capture measurements, shapes, and dimensions of an existing space. For example, a user may leverage light detection and ranging (LIDAR) capabilities of a mobile computing device in conjunction with an augmented reality program to scan an existing space and capture the measurements, shapes, and dimensions of the space. The existing space may include, for example, the architectural structure of a building, landscaping structures, semi-permanent or permanent structures within a space such as cabinetry, doors, windows, plumbing fixtures, and so forth, non-permanent structures within a space such as furniture and other furnishings, and so forth. In an embodiment, a LIDAR system is used to measure the distance from the LIDAR transmitter to a wall, cabinet, or other structure, and to thereby calculate the shapes, measurements, and dimensions of existing of rooms and other structures. These shapes, measurements, and dimensions may be provided as raw input data 306 for use in generating a three-dimensional rendering of a space. In an embodiment, the raw input data 306 includes raw LIDAR data.

In an embodiment, the raw input data 306 generated by augmented reality and/or LiDAR can be used to generate a geometric vector diagram of a scene. The geometric vector diagram includes x, y, z serialized data that may be used to generate a three-dimensional rendering of a scene. LiDAR includes the use of lasers for exceptional accuracy and augmented reality may be based more on a user's movement through an environment.

In an embodiment, the extrusion algorithm 310 is wrapped around a service layer that can run on the rendering server 110 independent of other backend processes performed by the rendering server 110. The extrusion algorithm 310 is configured to serialize the input 302 to generate serialized data 314 that can be provided to the renderer 316. The extrusion algorithm 310 may include instructions to be performed by one or more processors for reading the input 302, tracing the input 302 data, graphing the input 302 data, and prioritizing the input 302 data to generate the serialized data 314.

The output 312 of the extrusion algorithm 310 within the service layer 302 is serialized data 314. The extrusion algorithm 310 includes instructions for serialization to translate the input 302 to a format that can be stored, transmitted, and/or reconstructed later for other uses. When the serialized data 314 is reread according to the serialization format, the serialized data 314 can be used to create a semantically identical clone of the input 302.

The renderer 316 parses the serialized data 318 to generate a three-dimensional rendering of the input 302. In an embodiment, the renderer 316 is an application program interface (API) that may function as a real-time editor and generator of three-dimensional renderings of a space. The renderer 316 may create a three-dimensional rendering of a space that can be altered and interacted with by a user in real-time. The renderer 316 may create an image of a rendering of a space that may be saved, printed, or transmitted. In an embodiment, a user of the rendering platform 102 may interact with the renderer 316 API to amend the three-dimensional rendering by, for example, adding walls or other structures, moving wall or other structures, deleting walls or other structures, and so forth. The renderer 316 may be run on the rendering server 110 and may operate independently of the extrusion algorithm 310.

In an embodiment, the process flow 300 includes applying additional data and instructions to the output 312 of the service layer 308. This additional data and instructions can be provided to a third-party renderer 316 to enable the renderer 316 to parse the serialized data 318 and generate a three-dimensional model of the input 302. The renderer 316 may need to be instructed on how to generate the three-dimensional model. These additional instructions may include, for example, Z-axis coordinates applied to the serialized data 314. The serialized data 314 may include a geometric vector diagram representing lines and other objects within the input 302. Z-axis coordinates may additionally be applied to the geometric vector diagram to enable the renderer 316 to generate a three-dimensional model based on the two-dimensional input 302. This may be particularly useful in an implementation where the input image 304 is a two-dimensional drawing of an architectural floorplan, city design, landscaping design, and so forth, and the process flow 300 is applied to generate a three-dimensional model that represents the input image 304. The additional instructions may further include, for example, instructions on what data should be kept and what data should be discarded, and/or instructions on how to generate the three-dimensional model. These instructions may be implemented by "internal" processors for the rendering server 110 or may be provided to an external program configured to generate a three-dimensional model.

Figure 4:
FIG. 4 is a schematic block diagram illustrating process components of an extrusion algorithm as disclosed herein.

FIG. 4 is a schematic diagram illustrating a process flow 400 that may be performed by one or more processors executing the extrusion algorithm 310. Given a specific input 302, the service layer 308 may run a process including a plurality of layers to create the serialized data 314. In the process flow 400 illustrated in FIG. 4 the bottom of the extrusion algorithm 310 is the base layer and each layer builds upon the other.

Prior to performing the extrusion algorithm 310, the input 302 may be validated and normalized to a set standard. For example, the input 302 may be validated to determine whether the input 302 is of a sufficient quality for performing the extrusion algorithm 310. In an embodiment, the input 302 is validated to determine whether it satisfies certain conditions such as file size, dimensions, clarity, white balance, and so forth. After the input 302 is validated, the extrusion algorithm 310 includes creating a bitmap 402 based on the input 302. The bitmap 402 represents the input 302 as an image. In an embodiment, the bitmap 402 represents the input 302 as a Red-Green-Blue (RGB) image comprising eight bit channels. The bitmap 402 may be loaded to an image library in any standard image format such as jpg, jpeg, png, pdf, and so forth.

The extrusion algorithm 310 includes performing one or more of edge detection 404, line weight detection 406, and region detection 408 on the bitmap 402. The edge, line weight, and region detections 404-408 may be performed by executing value 412, decay 414, and follow peak 416 steps.

The value 412 step includes generating a binary map indicating the distance each pixel in the bitmap 402 is from the nearest edge. In an embodiment, the value 412 includes analyzing the color of each pixel and returning a binary integer indicating whether the pixel is "dark enough" to be considered as being "on" and further to be considered a portion of a line or other object within the input image.

The decay 414 step may include generating a depth map based on the binary map and indicating the distance each pixel is from the nearest edge. The decay 414 step may include receiving information from the value 412 step indicating whether pixels are "on" or "off" and then generating "mountains" from the lines. The "center" of a line is the peak of the mountain and the edge of the line is the lowest point in the mountain. The decay 414 layer may further fine tune the artifacts to keep or discard.

The follow peak 416 step may include tracing lines based on the depth map. The region detection 408 includes identifying closed regions, and this may be performed with a flood fill algorithm in some embodiments. The extrusion algorithm 310 may include identifying region types, for example, whether a region comprises a wall or a bank of cabinets, based on the results of the region detection 408. The follow peak 416 may be analogized to walking on a roofline until the roofline turns or terminates. In the analogy, a change in the direction to the roofline is similar to a change in direction of a line of the bitmap 402. When the "on" pixels of a line terminate in the original direction and continue in a different direction, the line has changed direction and may include an angle, a curve, or some other geometric change.

The edge detection 404 process is performed to identifying edges of "on" or "off" color pixels within the bitmap 402. The results of the edge detection 404 process can indicate where the perimeter of a floorplan is located, where walls within the floorplan are located, where cabinets within the floorplan are located, and so forth. The edge detection 404 process includes examining the bitmap 402 to determine the values 412 of RGB pixels and then determine whether those values 412 satisfy a threshold. The threshold indicates whether the value 412 of the pixel qualifies the pixel as being "on" or "off." A pixel that is deemed as being "on" may indicate a wall, cabinet, or other structure within the floorplan of the input 302 data. A pixel that is deemed as being "off" may indicate an open space or non-wall within the floorplan.

In an embodiment, the edge detection 404 process includes applying a stencil buffer of the same resolution of the bitmap 402 to represent pixels as being "on" or "off." The results of the stencil buffer will essentially yield a black and white solid shape. After the stencil buffer has been performed, then spaces within the stencil buffer can be sampled. In a perfect implementation, empty space pixels are a perfect white and non-empty space pixels (e.g., walls, cabinets, structures, and so forth) are a perfect black. In most implementations, this is not the case, and the pixels will return a range of values. In an embodiment, edge detection 404 process includes assigning a value 412 to each pixel and then grouping lighter pixel values together and grouping darker pixel values together. The lighter pixel values may be associated with pixels that are "off," i.e. pixels that represent an empty space in the floorplan. The darker pixel values 412 may be associated with pixels that are "on," i.e. pixels that represent a non-empty space within the floorplan such as a wall, cabinet, or other structure. This process may be done for each input 302 on a case-by-case basis. In an embodiment, the edge detection 404 process begins with finding a midpoint value within the image. Typically, there is a smaller range for the light values than for darker values, and therefore, it can be easier to identify what classifies as white within the bitmap 402. This process is typically more challenging when the input 302 is a photograph of a line drawing or other document rather than a direct input of a computer-generated line drawing.

In an example implementation of the edge detection 404 process, the extrusion algorithm 310 is performed on a black-and-white line drawing of an architectural floorplan. The bitmap 402 of the architectural floorplan may have a plurality of walls that need to be identified. The border pixels of the walls may be a darker color than the interior pixels of the walls. Even still, the walls in the architectural floorplan can be identified by sampling the pixels in the floorplan and determining whether the pixels are dark or light.

In an embodiment, the edge detection 404 process includes applying a growth algorithm. As discussed herein, a "growth algorithm" includes processes and algorithms associated with its inverse, which may commonly be referred to as a decay algorithm. A growth algorithm and a decay algorithm are inverses of one another and may functionally result in the same output information. Reference herein to a "growth algorithm" includes processes, steps, methods, and algorithms are associated with each of a growth algorithm and a decay algorithm. The growth algorithm may be applied to the bitmap 402 pixel-by-pixel to identify which pixels are "on" and which pixels are "off." The growth algorithm can be used to identify the edges and peaks of lines within the bitmap 402.

The line weight detection 406 process can be implemented to differentiate walls from other lines such as cabinets, doors, windows, and so forth. In typical floorplan drawings, walls will be illustrated with darker or thicker lines than other objects. In an embodiment, the stencil buffer provides valuable information for the line weight detection 406 step. It can be important to differentiate between walls, windows, cabinets, doors, and so forth, but in the stencil buffer stage, the input consists only of solid lines. After the stencil buffer is applied, the extrusion algorithm 310 includes identifying lines and assigning a weight to the lines. This may be performed by implementing a grow algorithm. The grow algorithm includes beginning from a center pixel within a line and growing from there to identify whether the pixel is part of a line, and further to identify the thickness of the line. At each layer, the width of the line will decrease.

In an embodiment, the growth algorithm includes removing a first layer of a line pixel-by-pixel. This first layer may be referred to as layer one. After the first layer of the line has been removed, the growth algorithm proceeds with removing the second layer of the line. The second layer of the line may be referred to as layer two. The growth algorithm includes counting the number of layers that are removed from the line until the center of the line has been reached. This count can be used to determine the thickness of the line.

In an embodiment, the growth algorithm is referred to as a decay 414 algorithm at the pixel level. As discussed herein, the term "growth algorithm" includes processes, steps, methods, and algorithms associated with a growth algorithm and/or a decay algorithm. The growth algorithm is built from the decay algorithm and may occur simultaneously as the growth algorithm and the decay algorithm work hand-in-hand. The growth algorithm travels around each line to add mass or weight while the decay algorithm performs the inverse of this operation. The decay algorithm may run very quickly to trim pixel edges off lines through a decay process. In an embodiment, a timestamp is recorded that represents when the decay algorithm reached a certain pixel. Termination of the decay algorithm may occur when all pixels have been removed from the bitmap 402.

After the decay 414 algorithm is performed, the peak of each line is identified and followed to identify the geometry of the line (see follow peak 416). This can be particularly useful in an implementation where lines within the floorplan are shaded differently to represent different structures. For example, interior walls and exterior walls may be shaded differently, or there may be a shading system for identifying load-bearing walls versus non-load-bearing walls, and so forth. When the peak is identified, the peak is followed continually until it ends. The peak ends when a different structure is identified. This may occur when a wall rounds a corner or ends, for example. After the end of the peak has been identified, then the algorithm returns to the first identified location of the peak, and the peak is traveled in the opposite direction until it ends again. In an embodiment, the results of this process are analyzed to identify patterns within input 302 drawing. Such patterns may include, for example, an indication that lines with certain weight ranges are associated with interior walls, exterior walls, load-bearing walls, non-load-bearing walls, cabinets, windows, doors, and so forth. These patterns can be saved and analyzed by a machine learning algorithm to aid in assessing future input 302 drawings.

In an embodiment, the ending point of the peak indicates where a line changes direction rather than a complete termination of the line. At a corner, curve, or other point where a line changes direction, the peak will terminate and begin again in the new direction. It should be appreciated that the ending point of a line may indicate the beginning of a new direction for the line. The ending point may signify where the line takes a turn of any angle.

After interior and exterior walls, cabinets, doors, windows, and so forth have been identified based on the line weight detection 406 process, the extrusion algorithm 310 performs region detection 408 to identify closed spaces within the floorplan or landscaping design. The region detection 408 includes determining where rooms or areas are connected or not connected. The region detection 408 process identifies enclosed regions such as rooms, cabinets, islands, and so forth. In an embodiment, the region detection 408 includes a flood fill algorithm. The flood fill algorithm includes analyzing the image to locate empty values, and then filling the corresponding region with a flood fill.

In an embodiment, the flood fill algorithm begins with a single pixel and fills in that pixel. The flood fill algorithm continues by identifying neighboring pixels and filling in those neighboring pixels. The flood fill algorithm continues this process recursively until hitting an edge such as a wall, cabinet, door, window, and so forth. The termination of the flood fill algorithm occurs when an edge has been reached. In an embodiment, each closed or open region is filled with a different color value. It should be appreciated that the flood fill algorithm may apply any color value to a region, including true black or true white. The region detection 408 steps can be used to identify enclosed areas and show the geometry within a certain region, and further to identify the width and shape of the region.

In an embodiment, the extrusion algorithm 310 further includes hiding and adding to the two-dimensional geometric space. Portions of the two-dimensional geometric space may be hidden and discarded. Additionally, the extrusion algorithm 310 may add to portions of the two-dimensional geometric space to apply vertical space by way of Z coordinates or other information needed to generate a three-dimensional rendering of the space.

The extrusion algorithm 310 results in a serialized data 314 output. In some embodiments, the serialized data 314 output may be referred to as metadata. The serialized data 314 represents the two-dimensional geometry extracted from the bitmap 402 and can be used to construct three-dimensional geometry. The serialized data 314 may be automatically created code that represents defined parameters. The parameters may include specific patterns found in a line drawing. The serialized data 314 output may be configured into any three-dimensional modeling editor and may be ready for common file extensions such as STL, OBJ, FBX, COLLADA, 3DS, IGES, STEP, VRML/X3D, and so forth.

Figure 5:
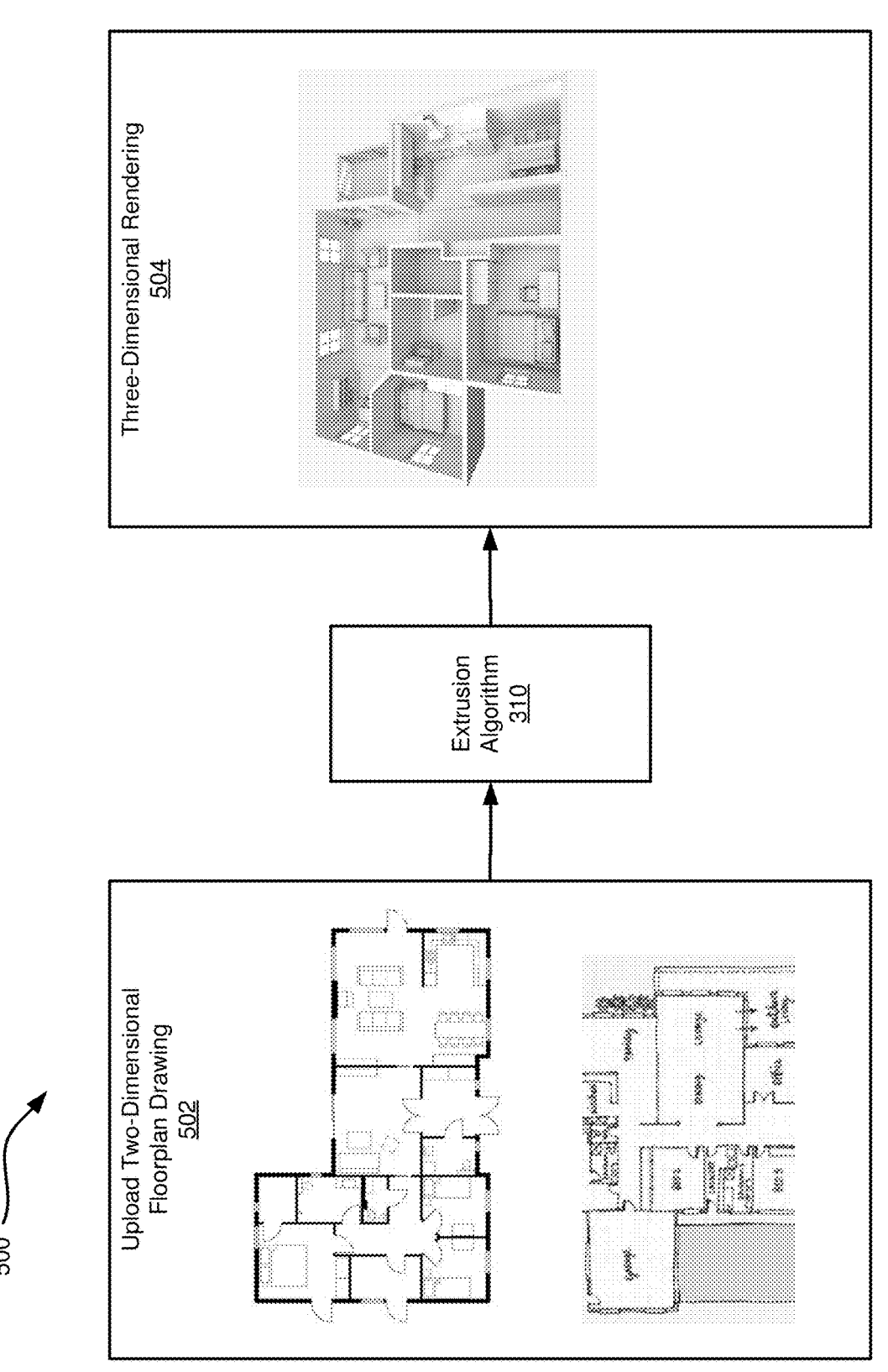
FIG. 5 is a process flow illustrating a two-dimensional floorplan input that can be processed by an extrusion algorithm to generate a three-dimensional rendering.

FIG. 5 illustrates a process flow 500 for inputting a floorplan drawing into the extrusion algorithm 310 and generating a three-dimensional rendering that represents the floorplan drawing. In an embodiment, a user uploads at 502 a two-dimensional floorplan drawing. The user may upload this drawing to the rendering server 110 by accessing a user interface for the rendering platform 102. The two-dimensional floorplan drawing is stored in the user database 124 and may be processed by one or more processors executing the extrusion algorithm 310. The output of the extrusion algorithm 310 is a vector map that can be used to generate a three-dimensional rendering 502 of the floorplan drawing.

Figure 6B:
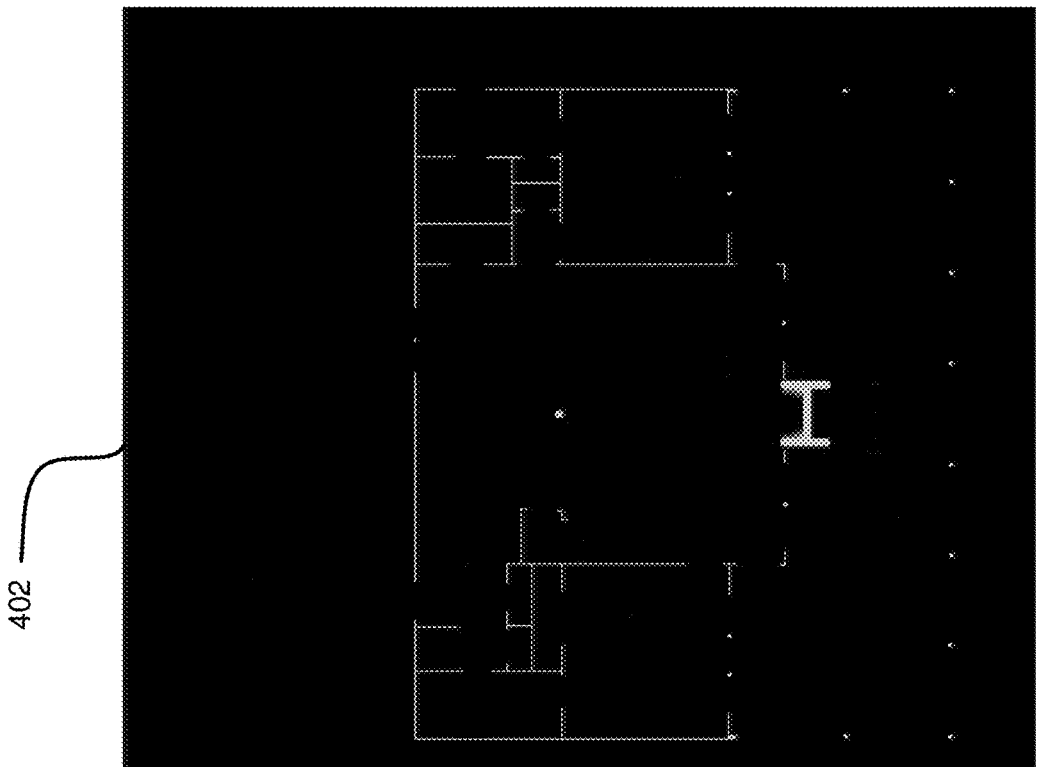
FIG. 6B is a bitmap corresponding with the input image illustrated in FIG. 6A.
Figure 6A:
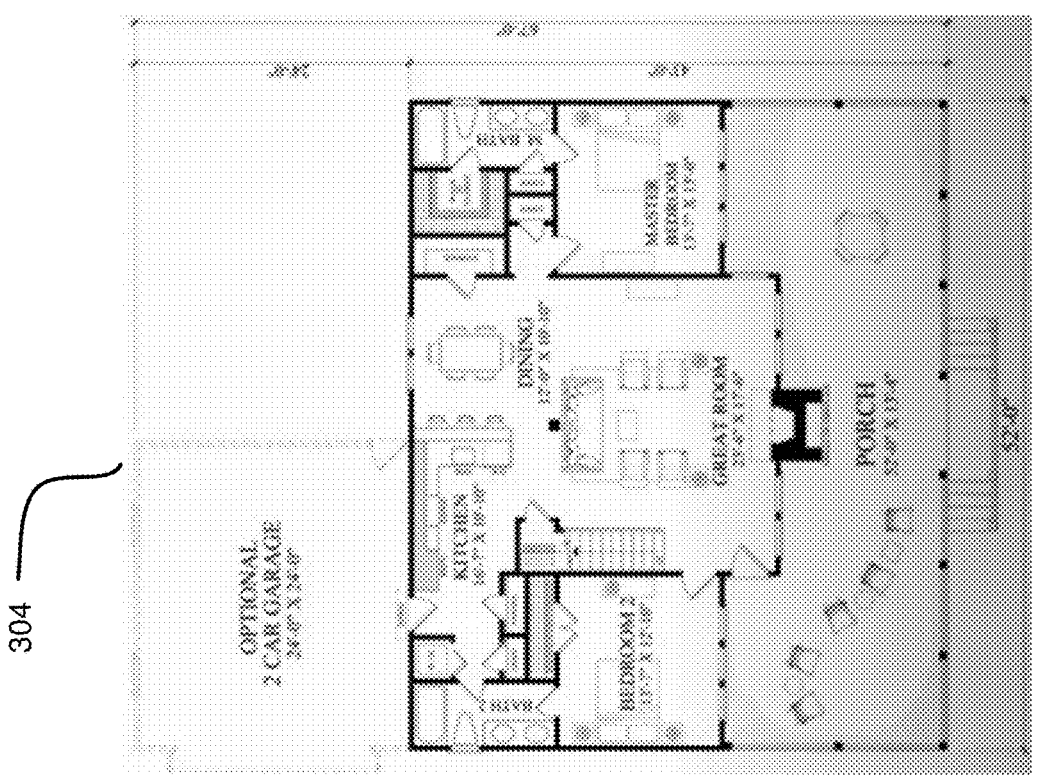
FIG. 6A is an exemplary input image comprising a two-dimensional computer-generated drawing of a residential floorplan.

FIGS. 6A and 6B illustrate an input image 304 and a corresponding bitmap 402, respectively. The input image 304 illustrated in FIG. 6A comprises a two-dimensional drawing of a residential floorplan. This exemplary input image 304 is computer-generated, although other hand-drawn input images 304 can also be processed as discussed herein. The input image 304 comprises a plurality of closed regions, including a porch, a master bedroom, a master bathroom, an additional bedroom, an additional bathroom, and a combined living space comprising a great room, a dining area, and a kitchen. These written indications may be read and stored by the rendering server 110 for possible future use. The input image 304 additionally comprises dimensions corresponding with real-world measurements. In an embodiment, the rendering server 110 reads and extracts these dimensions and stores them in the user database 124 for possible future use. The input image 304 additionally includes indications of whether lines indicate an exterior wall, an interior wall, a window, a door, a cabinet, or furniture. For example, as shown, the walls are marked with dark black lines, the windows are shown as a narrow rectangle within a wall, and the doors as shown as gaps in the walls with a triangular opening indicating which direction the door will swing. The cabinetry in the kitchen and the possible furniture are illustrated with faint black lines. This input image 304 may be processed according to the extrusion algorithm 310 to generate the bitmap 402 illustrated in FIG. 6B.

The bitmap 402 is a black-and-white drawing illustrating where the input image 304 data is "on" or "off." As shown in the exemplary bitmap 402 illustrated in FIG. 6B, the negative "off" space is a perfect black while the positive "on" space is white. The negative space represents the white areas and lighter-colored areas in the input image 304. The white lines represent the black areas and darker-colored areas in the input image 304. As shown, the white lines in the bitmap 402 correspond with the dark black lines in the input image 304 that represent the walls of the floorplan. The bitmap may be analyzed according to the steps of the extrusion algorithm to generate serialized data 314. The serialized data 314 may comprise a two-dimensional and/or three-dimensional vector diagram comprising information for generating a three-dimensional rendering of the floorplan illustrated in the input image 304.

FIG. 7 illustrates an exemplary grid of pixels in a bitmap. The pixels have been assigned a number indicating the result of performing a growth or decay algorithm on the grid of pixels. The pixels comprising a "0" (zero) designation are identified as being "off" or not comprising a line. The pixels comprising a "1" (one) or "2" (two) designation are identified as being "on" or comprising some black or darker-colored value. These pixels are likely part of a line in the original input image 304. The center peak of the line comprises the "2" designation. The neighboring pixels with a "1" designation are also "on" and comprise a black or darker-colored value in the original input image 304. These assignments indicate where the pixels are within the growth/decay algorithm process.

FIG. 8 illustrates an exemplary grid of pixels in a bitmap. Similar to the grid of pixels illustrated in FIG. 7, the pixels have been assigned a number indicating the result of performing a growth or decay algorithm. In contrast with FIG. 7, none of the pixels illustrated in FIG. 8 have a "0" designation indicating the pixel is "off" or comprising white or a lighter-colored value in the original input image 304. Each of the pixels illustrated in FIG. 8 comprises a designation of "1" (one), "2" (two), or "3" (three). These assignments indicate whether the pixels are within the growth/decay algorithm process. The center peak of the line are the pixels comprising the "3" designation. The surrounding neighboring pixels comprising a "2" designation or a "1" designation are removed on subsequent iterations of the growth/decay algorithm.

Figure 9:
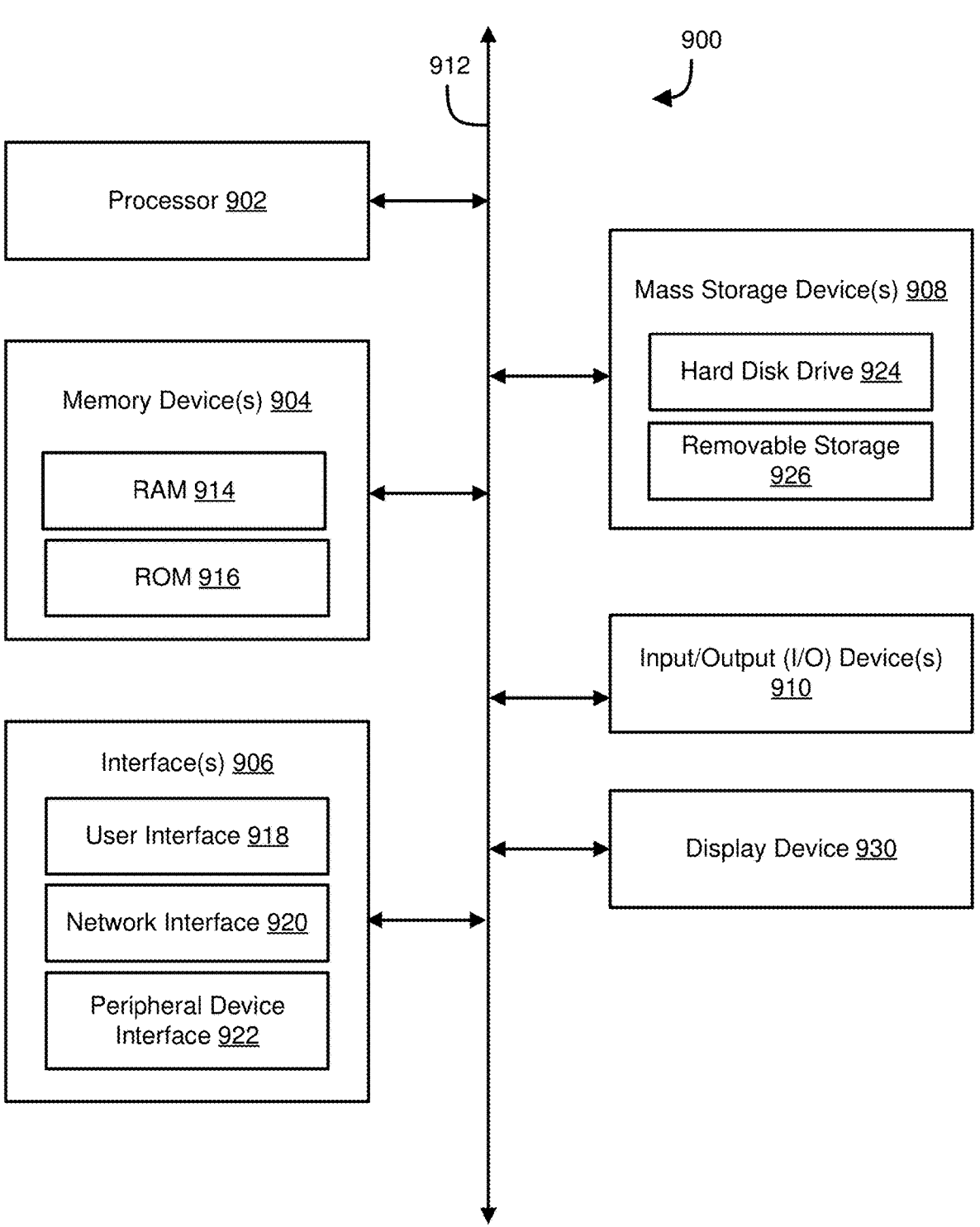
FIG. 9 is a schematic block diagram of an example computing system according to an example embodiment of the systems and methods described herein.

Referring now to FIG. 9, a block diagram of an example computing device 900 is illustrated. Computing device 900 may be used to perform various procedures, such as those discussed herein. Computing device 900 can perform various monitoring functions as discussed herein, and can execute one or more application programs, such as the application programs or functionality described herein. Computing device 900 can be any of a wide variety of computing devices, such as a desktop computer, in-dash computer, vehicle control system, a notebook computer, a server computer, a handheld computer, tablet computer and the like.

Computing device 900 includes one or more processor(s) 912, one or more memory device(s) 904, one or more interface(s) 906, one or more mass storage device(s) 908, one or more Input/output (I/O) device(s) 910, and a display device 930 all of which are coupled to a bus 912. Processor(s) 912 include one or more processors or controllers that execute instructions stored in memory device(s) 904 and/or mass storage device(s) 908. Processor(s) 912 may also include various types of computer-readable media, such as cache memory.

Memory device(s) 904 include various computer-readable media, such as volatile memory (e.g., random access memory (RAM) 914) and/or nonvolatile memory (e.g., read-only memory (ROM) 916). Memory device(s) 904 may also include rewritable ROM, such as Flash memory.

Mass storage device(s) 908 include various computer readable media, such as magnetic tapes, magnetic disks, optical disks, solid-state memory (e.g., Flash memory), and so forth. As shown in FIG. 9, a particular mass storage device 908 is a hard disk drive 924. Various drives may also be included in mass storage device(s) 908 to enable reading from and/or writing to the various computer readable media. Mass storage device(s) 908 include removable media 926 and/or non-removable media.

I/O device(s) 910 include various devices that allow data and/or other information to be input to or retrieved from computing device 900. Example I/O device(s) 910 include cursor control devices, keyboards, keypads, microphones, monitors, touchscreen devices, or other display devices, speakers, printers, network interface cards, modems, and the like.

Display device 930 includes any type of device capable of displaying information to one or more users of computing device 900. Examples of display device 930 include a monitor, display terminal, video projection device, and the like.

Interface(s) 906 include various interfaces that allow computing device 900 to interact with other systems, devices, or computing environments. Example interface(s) 906 may include any number of different network interfaces 920, such as interfaces to local area networks (LANs), wide area networks (WANs), wireless networks, and the Internet. Other interface(s) include user interface 918 and peripheral device interface 922. The interface(s) 906 may also include one or more user interface elements 918. The interface(s) 906 may also include one or more peripheral interfaces such as interfaces for printers, pointing devices (mice, track pad, or any suitable user interface now known to those of ordinary skill in the field, or later discovered), keyboards, and the like.

Bus 912 allows processor(s) 912, memory device(s) 904, interface(s) 906, mass storage device(s) 908, and I/O device(s) 910 to communicate with one another, as well as other devices or components coupled to bus 912. Bus 912 represents one or more of several types of bus structures, such as a system bus, PCI bus, IEEE bus, USB bus, and so forth.

For purposes of illustration, programs and other executable program components are shown herein as discrete blocks, although it is understood that such programs and components may reside at various times in different storage components of computing device 1800 and are executed by processor(s) 912. Alternatively, the systems and procedures described herein can be implemented in hardware, or a combination of hardware, software, and/or firmware. For example, one or more application specific integrated circuits (ASICs) can be programmed to carry out one or more of the systems and procedures described herein. As used herein, the terms "module" or "component" are intended to convey the implementation apparatus for accomplishing a process, such as by hardware, or a combination of hardware, software, and/or firmware, for the purposes of performing all or parts of operations disclosed herein. The terms "module" or "component" are intended to convey independent in how the modules, components, or their functionality or hardware may be implemented in different embodiments.

Various techniques, or certain aspects or portions thereof, may take the form of program code (i.e., instructions) embodied in tangible media, such as floppy diskettes, CD-ROMs, hard drives, a non-transitory computer readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, an EPROM, a flash drive, an optical drive, a magnetic hard drive, or another medium for storing electronic data. One or more programs that may implement or utilize the various techniques described herein may use an application programming interface (API), reusable controls, and the like. Such programs may be implemented in a high-level procedural, functional, object-oriented programming language to communicate with a computer system. However, the program(s) may be implemented in assembly or machine language, if desired. In any case, the language may be a compiled or interpreted language, and combined with hardware implementations.

It should be understood that many of the functional units described in this specification may be implemented as one or more components or modules, which are terms used to emphasize their implementation independence more particularly. For example, a component or module may be implemented as a hardware circuit comprising custom very large-scale integration (VLSI) circuits or gate arrays, off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components and may be embodied in any suitable form and organized within any suitable type of data structure. The operational data may be collected as a single data set or may be distributed over different locations including over different storage devices, and may exist, at least partially, merely as electronic signals on a system or network. The components may be passive or active, including agents operable to perform desired functions.

EXAMPLES

The following examples pertain to further embodiments.

Example 1 is a method. The method includes determining an input image comprising one or more lines and generating a bitmap based on the input image. The method includes performing edge detection on the bitmap to identify the one or more lines in the input image by applying a growth algorithm to pixels of the bitmap. The method includes calculating a pixel width of each of the one or more lines in the input image.

Example 2 is a method as in Example 1, wherein calculating the pixel width of each of the one or more lines in the input image comprises identifying a peak for each of the one or more lines, wherein a peak of a line represents one or two center-most pixels of the line.

Example 3 is a method as in any of Examples 1-2, further comprising: identifying a peak for each of the one or more lines, wherein a peak of a line represents one or two center-most pixels of the line; identifying a peak starting point for the line; following the peak of the line in a first direction beginning at the peak starting point and terminating at a first ending point of the line; and following the peak of the line in a second direction beginning at the peak starting point and terminating at a second ending point of the line.

Example 4 is a method as in any of Examples 1-3, wherein calculating the pixel width of each of the one or more lines comprises identifying a peak of each of the one or more lines and applying a decay algorithm to each of the one or more lines, wherein the decay algorithm begins at the peak of each of the one or more lines.

Example 5 is a method as in any of Examples 1-4, wherein the input image comprises a two-dimensional drawing of an architectural floorplan, and wherein the method further comprises identifying walls in the architectural floorplan based at least in part on the pixel width of each of the one or more lines.

Example 6 is a method as in any of Examples 1-5, further comprising: applying a Z-axis height to the walls in the architectural floorplan; and generating serialized data comprising a geometric vector diagram of the architectural floorplan, wherein the geometric vector diagram can be used to generate a three-dimensional rendering of the architectural floorplan illustrated in the input image.

Example 7 is a method as in any of Examples 1-6, wherein the input image comprises a two-dimensional drawing of an architectural floorplan, and wherein the method further comprises identifying enclosed regions within the architectural floorplan.

Example 8 is a method as in any of Examples 1-7, wherein identifying the enclosed regions within the architectural floorplan comprises: identifying a first pixel comprising an empty value and filling in the first pixel with a color; applying a flood fill to an enclosed region comprising the first pixel by identifying neighboring pixels to the first pixel and filling in the neighboring pixels with the color; recursively applying the flood fill to additional neighboring pixels within the enclosed region; and terminating the flood fill for the enclosed region when perimeter pixels comprising non-empty values are reached by the flood fill.

Example 9 is a method as in any of Examples 1-8, further comprising identifying a plurality of enclosed regions and applying a different color to each of the plurality of enclosed regions.

Example 10 is a method as in any of Examples 1-9, further comprising applying a stencil buffer to the bitmap, and wherein performing edge detection on the bitmap comprises performing edge detection on the bitmap after the stencil buffer has been applied.

Example 11 is a system comprising one or more processors for executing instructions stored in non-transitory computer readable storage media, wherein the instructions comprise any of the method steps of Examples 1-10.

Example 12 is non-transitory computer readable storage media storing instructions for execution by one or more processors, wherein the instructions comprise any of the method steps of Examples 1-10.

Reference throughout this specification to "an example" means that a particular feature, structure, or characteristic described in connection with the example is included in at least one embodiment of the present disclosure. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present disclosure may be referred to herein along with alternatives for the various components thereof. It is understood that such embodiments, examples, and alternatives are not to be construed as de facto equivalents of one another but are to be considered as separate and autonomous representations of the present disclosure.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive.

Those having skill in the art will appreciate that many changes may be made to the details of the above-described embodiments without departing from the underlying principles of the disclosure.

What is claimed is:

1. A method, comprising:
determining an input image comprising one or more lines;
    generating a bitmap based on the input image;
performing edge detection on the bitmap to identify the one or more lines in the input image by applying a growth algorithm to pixels of the bitmap; and
calculating a pixel width of each of the one or more lines in the input image, comprising:
identifying a peak for each of the one or more lines, wherein the peak of the line represents one or two center-most pixels of the line;
applying a decay algorithm to each of the one or more lines, wherein the decay algorithm begins at the peak of each of the one or more lines;
removing one layer at a time via the growth algorithm and the decay algorithm from each of the one or more lines until the peak of the one or more lines is reached; and
determining the pixel width or thickness of each of the one or more lines based on the number of layers removed to reach the peak of each of the one or more lines;
selecting a line of the one or more lines and identifying a peak starting point for the line;
following the peak of the line in a first direction along a length of the line, beginning at the peak starting point and terminating at a first ending point of the line;

following the peak of the line in a second direction along the length of the line, beginning at the peak starting point and terminating at a second ending point of the line;
wherein the first ending point of the line and the second ending point of the line define a geometry of the line;
identifying an artifact in the one or more lines of the input image;
deciding to keep or discard the artifact;
extruding serialized data comprising a geometric vector diagram based on the geometry of the line; and
generating a three-dimensional rendering of an interior space based on the geometric vector diagram, the input image, and the decision to keep or discard the artifact.

2. The method of claim 1, wherein the input image comprises a two-dimensional drawing of an architectural floorplan, and wherein the method further comprises identifying walls in the architectural floorplan based on one or more of the pixel width of each of the one or more lines, a color of pixels within the architectural floorplan, or regions defined within the architectural floorplan.

3. The method of claim 2, further comprising:
applying a Z-axis height to the walls in the architectural floorplan; and
wherein the geometric vector diagram can be used to generate the three-dimensional rendering of the architectural floorplan illustrated in the input image.

4. The method of claim 1, wherein the input image comprises a two-dimensional drawing of an architectural floorplan, and wherein the method further comprises identifying enclosed regions within the architectural floorplan.

5. The method of claim 4, wherein identifying the enclosed regions within the architectural floorplan comprises:
identifying a first pixel comprising an empty value and filling in the first pixel with a color;
applying a flood fill to an enclosed region comprising the first pixel by identifying neighboring pixels to the first pixel and filling in the neighboring pixels with the color;
recursively applying the flood fill to additional neighboring pixels within the enclosed region; and
terminating the flood fill for the enclosed region when perimeter pixels comprising non-empty values are reached by the flood fill.

6. The method of claim 5, further comprising identifying a plurality of enclosed regions and applying a different color to each of the plurality of enclosed regions.

7. The method of claim 1, further comprising applying a stencil buffer to the bitmap, and wherein performing edge detection on the bitmap comprises performing edge detection on the bitmap after the stencil buffer has been applied.

8. The method of claim 1, further comprising:
determining input data wherein the input image data includes code from an augmented reality program;
determining a second line based on the code from the augmented reality program, wherein the second line is used for the three-dimensional rending.

9. The method of claim 1, wherein the input image includes data from a light detection ad ranging (LIDAR) device the data represents a LIDAR scan of the interior space.

10. The method of claim 1, wherein the three-dimensional rendering is a three-dimensional model that is interactive in real-time and the three-dimensional model can be amended by a user to change the three-dimensional model.

11. A system comprising one or more processors configurable to execute instructions stored in non-transitory computer readable storage media, the instructions comprising:

determining an input image comprising one or more lines;

generating a bitmap based on the input image;

performing edge detection on the bitmap to identify the one or more lines in the input image by applying a growth algorithm to pixels of the bitmap; and calculating a pixel width of each of the one or more lines in the input image, comprising:

identifying a peak for each of the one or more lines, wherein the peak of the line represents one or two center-most pixels of the line; and applying a decay algorithm to each of the one or more lines, wherein the decay algorithm begins at the peak of each of the one or more lines;

removing one layer at a time via the growth algorithm and the decay algorithm from each of the one or more lines until the peak of the one or more lines is reached; and determining the pixel width or thickness of each of the one or more lines based on the number of layers removed to reach the peak of each of the one or more lines;

selecting a line of the one or more lines and identifying a peak starting point for the line;

following the peak of the line in a first direction along a length of the line, beginning at the peak starting point and terminating at a first ending point of the line;

following the peak of the line in a second direction along the length of the line, beginning at the peak starting point and terminating at a second ending point of the line;

wherein the first ending point of the line and the second ending point of the line define a geometry of the line;

identifying an artifact in the one or more lines of the input image;

deciding to keep or discard the artifact;

extruding serialized data comprising a geometric vector diagram based on the geometry of the line; and generating a three-dimensional rendering of an interior space based on the geometric vector diagram, the input image, and the decision to keep or discard the artifact.

12. The system of claim 11, wherein the input image comprises a two-dimensional drawing of an architectural floorplan, and wherein the instructions further comprise identifying walls in the architectural floorplan based at least in part on the pixel width of each of the one or more lines.

13. Non-transitory computer readable storage media storing instructions for execution by one or more processors, the instructions comprising:

determining an input image comprising one or more lines;

generating a bitmap based on the input image;

performing edge detection on the bitmap to identify the one or more lines in the input image by applying a growth algorithm to pixels of the bitmap;

calculating a pixel width of each of the one or more lines in the input image, comprising;

removing one layer at a time via the growth algorithm and a decay algorithm from each of the one or more lines until a peak of the one or more lines is reached; and determining the pixel width or thickness of each of the one or more lines based on the number of layers removed to reach the peak of each of the one or more lines;

identifying an artifact in the one or more lines of the input image;

deciding to keep or discard the artifact;

extruding serialized data comprising a geometric vector diagram based on the geometry of the line; and generating a three-dimensional rendering of an interior space based on the geometric vector diagram, the input image, and the decision to keep or discard the artifact.

14. The non-transitory computer readable storage media of claim 13, wherein the input image comprises a two-dimensional drawing of an architectural floorplan, and wherein the instructions further comprise:

identifying walls in the architectural floorplan based at least in part on the pixel width of each of the one or more lines;

applying a Z-axis height to the walls in the architectural floorplan; and wherein the geometric vector diagram can be used to generate the three-dimensional rendering of the architectural floorplan illustrated in the input image.

15. The non-transitory computer readable storage media of claim 13, wherein the input image comprises a two-dimensional drawing of an architectural floorplan, and wherein the instructions further comprise identifying enclosed regions within the architectural floorplan.

16. The non-transitory computer readable storage media of claim 15, wherein the instructions are such that identifying the enclosed regions within the architectural floorplan comprises:

identifying a first pixel comprising an empty value and filling in the first pixel with a color;

applying a flood fill to an enclosed region comprising the first pixel by identifying neighboring pixels to the first pixel and filling in the neighboring pixels with the color;

recursively applying the flood fill to additional neighboring pixels within the enclosed region; and terminating the flood fill for the enclosed region when perimeter pixels comprising non-empty values are reached by the flood fill.

17. The non-transitory computer readable storage media of claim 13, wherein the instructions further comprise applying a stencil buffer to the bitmap, and wherein the instructions are such that performing edge detection on the bitmap comprises performing edge detection on the bitmap after the stencil buffer has been applied.

18. The non-transitory computer readable storage media of claim 13, wherein the calculating the pixel width of each of the one or more lines further comprises:

identifying the peak for each of the one or more lines, wherein the peak of the line represents one or two center-most pixels of the line; and applying the decay algorithm to each of the one or more lines, wherein the decay algorithm begins at the peak of each of the one or more lines;

selecting a line of the one or more lines and identifying a peak starting point for the line;

following the peak of the line in a first direction along a length of the line, beginning at the peak starting point and terminating at a first ending point of the line; and following the peak of the line in a second direction along the length of the line, beginning at the peak starting point and terminating at a second ending point of the line;

wherein the first ending point of the line and the second ending point of the line define a geometry of the line.

* * * * *